United States Patent
Moro et al.

(10) Patent No.: US 9,401,491 B2
(45) Date of Patent: Jul. 26, 2016

(54) DIRECT/LAMINATE HYBRID ENCAPSULATION AND METHOD OF HYBRID ENCAPSULATION

(71) Applicant: SAMSUNG SDI CO., LTD., Yongin-Si, Gyeonggi-Do (KR)

(72) Inventors: Lorenza Moro, Palo Alto, CA (US); Damien Boesch, San Jose, CA (US); Xianghui Zeng, Albany, CA (US)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 14/723,366

(22) Filed: May 27, 2015

(65) Prior Publication Data

US 2015/0348803 A1    Dec. 3, 2015

Related U.S. Application Data (60) Provisional application No. 62/006,038, filed on May 30, 2014.

(51) Int. Cl.

| | | |
|---|---|---|
| *H01L 21/00* | (2006.01) | |
| *H01L 51/44* | (2006.01) | |
| *H01L 51/52* | (2006.01) | |
| *H01L 23/538* | (2006.01) | |
| *H01L 31/048* | (2014.01) | |

(52) U.S. Cl.
CPC .......... *H01L 51/448* (2013.01); *H01L 23/5383* (2013.01); *H01L 31/048* (2013.01); *H01L 51/5237* (2013.01); *H01L 51/5246* (2013.01); *H01L 51/5256* (2013.01); *H01L 2924/181* (2013.01)

(58) Field of Classification Search
CPC ..................... H01L 51/5237; H01L 2924/181; H01L 31/048; H01L 23/5383; H01L 51/5246; H01L 51/448

See application file for complete search history.

(56) References Cited

U.S. PATENT DOCUMENTS

| | | | |
|---|---|---|---|
| 7,393,581 B2 | 7/2008 | Kim et al. | |
| 2008/0131646 A1* | 6/2008 | Tanaka | B32B 27/08 428/76 |
| 2009/0202899 A1* | 8/2009 | Pyszczek | H01M 6/06 429/152 |

(Continued)

OTHER PUBLICATIONS

Unknown, "TransFlex-ALD™ Roll-to-Roll Atomic Layer Deposition, based on Substrate Translation, by Lotus Applied Technology", www.lotusat.com, date unknown, pp. 1-2.
Moro, L. et al., "Environmental barriers for flexible displays", 6th International Exhibition and Conference for the Printed Electronic Industry, May 27-28, 2014, Messe Munchen, DE, pp. 1-35.
Morrison, N. PhD, "R2R CVD Tool Design for Next Generation Barrier Layer Processing", 2015 Flex Conference, FlexTech Alliance, Monterey, USA, Feb. 26, 2015, 16 pages.

(Continued)

*Primary Examiner* — Ngan Ngo
(74) *Attorney, Agent, or Firm* — Lewis Roca Rothgerber Christie LLP (57) ABSTRACT

An encapsulated device achieves good water vapor transmission rates while reducing the amount of time needed in an inert environment, and thereby reducing the size of the deposition tool used to encapsulate the device. The encapsulated device includes a first barrier layer deposited directly on the device, and a first adhesive and first laminate on the first barrier layer. The laminate comprises a polymeric substrate and a second barrier layer on the substrate. The first barrier layer has a water vapor transmission rate suitable to allow lamination of the laminate on the first barrier layer in a non-inert environment. A method of making an encapsulated device comprises depositing a first barrier layer on the device in an inert environment, applying an adhesive on the first barrier layer in a non-inert environment, and applying a first laminate on the first adhesive in the non-inert environment.

11 Claims, 5 Drawing Sheets

(56) References Cited

U.S. PATENT DOCUMENTS

| | | | | |
|---|---|---|---|---|
| 2014/0302373 A1* | 10/2014 | Lockett | C07D 233/58 | 429/124 |
| 2015/0076469 A1* | 3/2015 | Ikemizu | C09K 11/88 | 257/40 |
| 2015/0108403 A1* | 4/2015 | Kawamura | C09K 19/0403 | 252/299.63 |
| 2015/0190989 A1* | 7/2015 | Inuduka | G02B 5/26 | 428/336 |
| 2015/0194541 A1* | 7/2015 | Spagnola | B32B 33/00 | 136/256 |

OTHER PUBLICATIONS

Galewski, C. et al., "Flexible Plasma-Deposited Encapsulation Barrier for OLED Displays"; PlasmaSi, Inc., Fremont, CA and San Jose Research Center, Samsung Cheil Industries, Inc., San Jose, CA, Aug. 28, 2014, pp. 1-20.

Fahlteich, J. et al., "Ultra-high permeation barriers and functional films for large-area flexible electrons", LOPE-C 2014 Munchen, May 28, 2014, 17 pages.

Maydannik, P. S. et al., "Roll-to-roll atomic layer deposition process for flexible electronics encapsulation applications", J. Vac. Sci. Techol. A 32(5), Sep./Oct. 2014, pp. 051603-1 to 051603-7.

* cited by examiner

DIRECT/LAMINATE HYBRID ENCAPSULATION AND METHOD OF HYBRID ENCAPSULATION

CROSS-REFERENCE TO RELATED APPLICATION(S)

This application claims priority to and the benefit of U.S. Provisional Application Ser. No. 62/006,038, filed on May 30, 2014 and titled HYBRID ENCAPSULATION FOR OLED DEVICES, the entire content of which is incorporated herein by reference.

BACKGROUND

Many devices, such as organic light emitting devices and the like, are susceptible to degradation from the permeation of certain liquids and gases, such as water vapor and oxygen present in the environment, and other chemicals that may be used during the manufacture, handling or storage of the product. To reduce permeability to these damaging liquids, gases and chemicals, the devices are typically encapsulated with a multilayer barrier stack adjacent one or both sides of the device.

Figure 4:
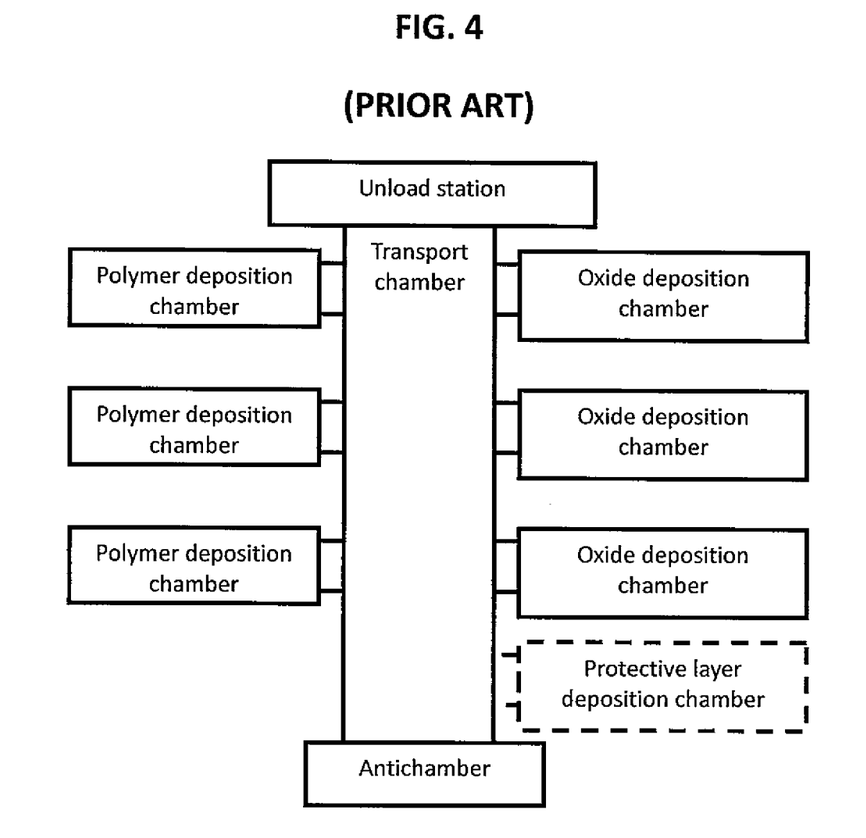
FIG. 4 is a schematic view of a conventional deposition machine including multiple deposition chambers, all of which are maintained in inert conditions.

In general, a barrier stack includes multiple dyads, each dyad being a two-layered structure including a barrier layer and a decoupling layer. The barrier stack can be deposited directly on the device to be protected, or may be deposited on a separate film or support, and then laminated onto the device. Because the device to be encapsulated by the barrier stack is sensitive to water vapor and oxygen, deposition of the barrier stack (whether by direct encapsulation or lamination) is conducted in an inert environment so as not to expose the device to the damaging gasses during the deposition process (and before the protective stack has been deposited). In particular, these sensitive devices are typically encapsulated by entering them into a deposition machine having multiple chambers, all of which are maintained in an inert condition (i.e., devoid of reactive gasses and species, such as, e.g., water vapor and oxygen). However, as noted above, barrier stacks typically include multiple dyads, which increases the size of the machine needed to deposit the stack. Specifically, as shown in FIG. 4, a conventional deposition machine for depositing a barrier stack having three dyads has six (or seven if a protective layer is deposited) separate deposition chambers, all of which must be maintained under inert conditions. The numerous deposition chambers needed for deposition of each layer under inert conditions increases the size and cost of the machine, leading to increased manufacturing costs not only in the costs associated with maintaining inert conditions in multiple chambers, but also in the costs associated with housing and maintaining such a large machine.

SUMMARY

According to some embodiments of the present invention, an encapsulated device includes a first barrier layer comprising a first barrier material deposited directly on the device. The encapsulated device further includes a first adhesive on the first barrier layer, and a first laminate on the adhesive. The first laminate includes a polymeric substrate and a second barrier layer on the polymeric substrate, and the second barrier layer includes a second barrier material. The first barrier layer has a water vapor transmission rate suitable to allow application of the adhesive and lamination of the first laminate on the first barrier layer in a non-inert environment.

The first laminate may further include a decoupling layer between the polymeric substrate and the second barrier layer. The decoupling layer and the second barrier layer form a dyad. In some embodiments, the first laminate includes two or more dyads.

The encapsulated device may further include one or more second laminates on the first laminate. Each of the second laminates may include a second polymeric substrate and a third barrier layer on the second polymeric substrate. The third barrier layer includes a third barrier material. The encapsulated device may further include a second adhesive between the first laminate and the one or more second laminates, and between the one or more second laminates.

The first, second and third barrier materials may each be independently selected from metals, metal oxides, metal nitrides, metal oxynitrides, metal carbides, metal oxyborides, Al, Zr, Zn, Sn, Ti, and combinations thereof. The first and second adhesives may each include a pressure-sensitive adhesive.

BRIEF DESCRIPTION OF THE DRAWINGS

These and other features and advantages of the present invention will be better understood by reference to the following detailed description when considered in conjunction with the following drawings, in which.

DETAILED DESCRIPTION

In embodiments of the present invention, an encapsulated device includes a first barrier layer directly deposited on the device, a first adhesive on the first barrier layer, and a first laminate on the first adhesive. The first barrier layer includes a first barrier material that is directly deposited on the device to be encapsulated, and exhibits a water vapor transmission rate that is suitable to allow application of the first adhesive and lamination of the first laminate on the first barrier layer in a non-inert environment. As used herein, the water vapor transmission rate suitable to allow application of the first adhesive and lamination of the first laminate in a non-inert environment refers to any water vapor transmission rate that is suitable for protecting the encapsulated device from the ingress of damaging water vapor for the amount of time needed to apply the first adhesive and first laminate. Indeed, the first barrier layer need not be a suitable "long-term" barrier layer, but should be capable of substantially preventing damage to the device during its exposure to ambient (or non-inert) conditions while the first adhesive and first laminate are being deposited. In some embodiments, for example, the first barrier layer may exhibit a water vapor transmission rate on the order of $10^{-3}$ g/m$^2$·day to $10^{-6}$ g/m$^2$·day, or $10^{-4}$ g/m$^2$·day to $10^{-6}$ g/m$^2$·day, or $10^{-4}$ g/m$^2$·day to $10^{-5}$ g/m$^2$·day, or $10^{-5}$ g/m$^2$·day to $10^{-6}$ g/m$^2$·day.

Additionally, as used herein, the terms "non-inert environment," "non-inert conditions" and similar or like terms, refer to an environment that is not inert, and therefore would normally damage a sensitive device that has not been encapsulated or otherwise protected from, e.g., water vapor and/or oxygen. For example, the terms "non-inert environment," "non-inert conditions" and similar or like terms refer to air or ambient conditions, as well as other environments or conditions that are potentially reactive rather than inert.

The first barrier layer is directly deposited on the device to be encapsulated, and includes a first barrier material. The first barrier layer operates as a temporary barrier layer, preventing the permeation of damaging gases, liquids and chemicals to the encapsulated device for a period of time sufficient to complete application of the first adhesive and the first laminate. As noted above, the first barrier layer need not be a good "long-term" barrier, and may be any barrier layer suitable for preventing the ingress of harmful gasses and chemicals (e.g., water vapor and oxygen) to the encapsulated device during the time needed to apply the first adhesive and the first laminate, Deposition of the first barrier layer may vary depending on the material used for the layer. However, in general, any deposition technique and any deposition conditions can be used to deposit the first (direct) barrier layer. For example, the first barrier layer may be deposited using a vacuum process, such as sputtering, chemical vapor deposition, metalorganic chemical vapor deposition, plasma enhanced chemical vapor deposition, evaporation, sublimation, electron cyclotron resonance-plasma enhanced chemical vapor deposition, and combinations thereof.

In some embodiments, however, the first barrier layer is deposited by AC or DC sputtering. For example, in some embodiments, the first barrier layer is deposited directly on the device by AC sputtering. The AC sputtering deposition technique offers the advantages of faster deposition, better layer properties, process stability, control, fewer particles and fewer arcs. The conditions of the AC sputtering deposition are not particularly limited, and as would be understood by those of ordinary skill in the art, the conditions will vary depending on the area of the target and the distance between the target and the substrate. In some exemplary embodiments, however, the AC sputtering conditions may include a power of about 3 to about 6 kW, for example about 4 kW, a pressure of about 2 to about 6 mTorr, for example about 4.4 mTorr, an Ar flow rate of about 80 to about 120 seem, for example about 100 seem, a target voltage of about 350 to about 550 V, for example about 480V, and a track speed of about 90 to about 200 cm·min, for example about 141 cm/min. Also, although the inert gas used in the AC sputtering process can be any suitable inert gas (such as helium, xenon, krypton, etc.), in some embodiments, the inert gas is argon (Ar).

The material of the first barrier layer is not particularly limited, and may be any material suitable for substantially preventing or reducing the permeation of damaging gases, liquids and chemicals (e.g., oxygen and water vapor) to the encapsulated device for the time needed to complete application of the adhesive and the laminate. Some nonlimiting examples of suitable materials for the first barrier layer include metals, metal oxides, metal nitrides, metal oxynitrides, metal carbides, metal oxyborides, and combinations thereof. Those of ordinary skill in the art would be capable of selecting a suitable metal for use in the oxides, nitrides and oxynitrides based on the desired properties of the layer. However, in some embodiments, for example, the metal may be Al, Zr, Si, Zn, Sn or Ti.

In some embodiments, for example, the first barrier layer may include an $SiN_x$ material, which may be deposited by any suitable method. For example, plasma enhanced chemical vapor deposition (PECVD) in a shower head configuration with a stationary substrate may be used. Linear sources may also be used with a scanning substrate. In some embodiments, such a $SiN_x$ barrier layer may have a water vapor transmission rate on the order of $10^{-5}$ g/m$^2$·day. PECVD $SiN_x$ barriers provide high deposition rates, and yield high density barriers with good performance. For example, in some embodiments, the $SiN_x$ layer may have a density of about 2.3 to about 3.0 2.7 g/cm$^3$, for example about 2.7 g/cm$^3$.

Additionally, in some embodiments, the first barrier layer may include an aluminum oxide (e.g., $Al_2O_3$), titanium dioxide (e.g., $TiO_2$), or an aluminum-titanium oxide (e.g., $Al_xTi_yO_z$). Any suitable deposition technique may be used to deposit these layers. However, in some embodiments, the aluminum oxide (e.g., $Al_2O_3$), titanium dioxide (e.g., $TiO_2$), or aluminum-titanium oxide (e.g., $Al_xTi_yO_z$) layer may be deposited via atomic layer deposition (ALD).

The density and refractive index of the first barrier layer are not particularly limited and will vary depending on the material of the layer. However, in some exemplary embodiments, the first barrier layer may have a refractive index of about 1.6 or greater, e.g., 1.675. The thickness of the first barrier is also not particularly limited. However, in some exemplary embodiments, the thickness is about 15 nm to about 2 microns, for example about 20 nm to about 100 nm, or about 40 nm to about 70 nm. In some embodiments, for example, the thickness of the first barrier layer is about 40 nm. In some embodiments (e.g., $SiN_x$ barrier layers, including PECVD $SiN_x$ layers), the first barrier layer may have a thickness of about 100 nm to about 2 microns. Also, in some embodiments (e.g., ALD layers of aluminum oxide, titanium dioxide or aluminum-titanium oxides), the first barrier layer may have a thickness of about 15 nm to about 50 nm. As is known to those of ordinary skill in the art, thickness is dependent on density, and density is related to refractive index. See, e.g., Smith, et al., "Void formation during film growth: A molecular dynamics simulation study," J. Appl. Phys., 79 (3), pgs. 1448-1457 (1996); Fabes, et al., "Porosity and composition effects in sol-gel derived interference filters," Thin Solid Films, 254 (1995), pgs. 175-180; Jerman, et al., "Refractive index of this films of $SiO_2$, $ZrO_2$, and $HfO_2$ as a function of the films' mass density," Applied Optics, vol. 44, no. 15, pgs. 3006-3012 (2005); Mergel, et al., "Density and refractive index of $TiO_2$ films prepared by reactive evaporation," Thin Solid Films, 3171 (2000) 218-224; and Mergel, D., "Modeling $TiO_2$ films of various densities as an effective OPTICAL medium," Thin Solid Films, 397 (2001) 216-222, all of which are incorporated herein by reference. Also, the correlation between film density and barrier properties is described, e.g., in Yamada, et al., "The Properties of a New Transparent and Colorless Barrier Film," Society of Vacuum Coaters, 505/856-7188, 38$^{th}$ Annual Technical Conference Proceedings (1995) ISSN 0737-5921, the entire content of which is also incorporated herein by reference. Accordingly, those of ordinary skill in the art would be able to calculate the density of the first barrier layer based on the refractive index and/or thickness information.

The first adhesive may be any adhesive suitable for use with sensitive devices, such as organic light emitting device, and which enables adhesion of the first (or second, as discussed further below) laminate to the first barrier layer. In some embodiments, for example, the adhesive may include a curable liquid adhesive, or a pressure-sensitive adhesive having a low water vapor transmission rate. In some embodiments, for example, the adhesive may include a pressure-sensitive adhesive tape (e.g., those available from Tesa SE, including Tesa 61500 and 61501). Such a tape provides a tacky surface for adhesion of the laminate, and also serves as a buffer layer absorbing much of the pressure during the lamination process. For example, in some embodiments, the adhesive may be a UV curable epoxy adhesive, nonlimiting examples of which include the DELO line of adhesives (e.g., DELO KatioBond LP686, LP655, LP612, and VE110214), available from Delo Industrial Adhesives (Windach, Germany). Additional nonlimiting examples of suitable adhesives include EL-92734 (a pressure sensitive adhesive) available from Adhesives Research, Inc., Glen Rock, Pa.); AC A1429-F1 and AC A1430-B (UV curable epoxy sealants) available from Addison Clear Wave, St. Charles, Ill.; B-Dry (thermoplastic), ZeoGlue (UV curable dispersion of nano-zeolites in an epoxy matrix), AqvaDry-U1 (UV cure) and AqvaDry-T1 (thermal cure), DryPaste (thermal cure) available from SAES Getters Group, Italy; Tesa 61500 (25 micron transparent barrier tape with Tesa DrySeal liner) and Tesa 61501 (50 micron transparent transfer barrier tape with Tesa DrySeal liner) available from Tesa SE, Germany.

Using a liquid adhesive (such as, e.g., a liquid curable adhesive, or a liquid pressure-sensitive adhesive), serves a dual purpose. First, the liquid adhesive provides a tacky surface for adhesion of the laminate (first and/or second, as discussed below). Second, the liquid adhesive can serve as a buffer layer between the laminate and the first barrier layer, absorbing much of the pressure used to adhere the laminate to the first barrier layer. Indeed, although a non-liquid adhesive may also be used, in applying pressure to the laminate to adhere it to the first barrier layer, some of that pressure may be absorbed by the device being encapsulated, and thereby cause some damage to the device. In contrast, when a liquid adhesive is used, the liquid is still deformable during the application of pressure necessary to adhere the laminate, and therefore absorbs and dissipates the force from the pressure away from the device.

In some embodiments, a liquid adhesive may be used to form a seal at the edges of the device. In such situations, a mask may be used to protect the underlying device from the pressure used to adhere the laminate to the first barrier layer. For example, to compensate for the potential damage to the device, the mask can be placed on the outer edges of the device. According to this scheme, the mask diverts the applied pressure primarily to regions external to the sensitive organic layers of the device, and redistributes the pressure from the organic layers of the device to the external regions of the device, thereby dissipating the pressure on the organic regions of the device and preventing or substantially reducing damage caused by the application of pressure. The cavity inside the edges may be left empty, or may be filled with a material or materials capable of providing a refractive index gradient for improving light extraction, or materials capable of performing a getter function to capture moisture permeating through defects.

The first laminate includes a polymeric substrate and a second barrier layer on the polymeric substrate. The second barrier layer includes a second barrier material. The first laminate may further include a decoupling layer between the polymeric substrate and the second barrier layer. In some embodiments in which the first laminate includes a decoupling layer, the decoupling layer and the second barrier layer form a dyad. In some embodiments, the first laminate may include one or more dyads (i.e., one or more decoupling layer/second barrier layer couplings) to form a multi-layer barrier stack on the polymeric substrate of the first laminate.

In some embodiments, the encapsulated device may further include one or more second laminates in addition to the first laminate. The one or more second laminates may be laminated on the first laminate via a second adhesive, which may be the same as or different from the first adhesive. The second laminates are similar to the first laminate, and each second laminate may include a second polymeric substrate, and a third barrier layer on the second polymeric substrate. The third barrier layer includes a third barrier material. The second adhesive may be used to adhere one of the second laminates to the first laminate, and/or to adhere two of the second laminates to each other. As such, the second adhesive may be between the first laminate and the third barrier layer of one of the second laminates, and/or between the second polymeric substrate of one of the second laminates and the third barrier layer of another of the second laminates.

In some embodiments of the present invention, the first and/or second laminates of the encapsulated device include the second and/or third barrier layer(s) on the respective first or second polymeric substrate(s), as described above. In some embodiments, however, the first and/or second laminates may include at least one dyad on the respective first or second polymeric substrate. Each of the dyads includes a decoupling layer (also referred to herein as a smoothing or planarization layer), and the second or third barrier layer of the respective first or second laminate. The decoupling layer of the dyad includes a polymer or other organic material that serves as a planarization, decoupling and/or smoothing layer. Specifically, the decoupling layer decreases surface roughness, and encapsulates surface defects, such as pits, scratches, digs and particles, thereby creating a planarized surface that is ideal for the subsequent deposition of additional layers. As used herein, the terms "smoothing layer," "decoupling layer," and "planarization layer" are used interchangeably, and all terms refer to the decoupling layer, as now defined. The decoupling layer may be deposited on the first or second polymeric substrate by any suitable deposition technique, some nonlimiting examples of which include vacuum processes and atmospheric processes. Some nonlimiting examples of suitable vacuum processes for deposition of the decoupling layer include flash evaporation with in situ polymerization under vacuum, and plasma deposition and polymerization. Some nonlimiting examples of suitable atmospheric processes for deposition of the decoupling layer include spin coating, ink jet printing, screen printing and spraying.

The decoupling layer can include any suitable material capable of acting as a planarization, decoupling and/or smoothing layer. Some nonlimiting examples of suitable such materials include organic polymers, inorganic polymers, organometallic polymers, hybrid organic/inorganic polymer systems, and silicates. In some embodiments, for example, the material of the decoupling layer may be an acrylate-containing polymer, an alkylacrylate-containing polymer (including but not limited to methacrylate-containing polymers), or a silicon-based polymer.

The decoupling layer can have any suitable thickness such that the layer has a substantially planar and/or smooth layer surface. As used herein, the term "substantially" is used as a term of approximation and not as a term of degree, and is intended to account for normal variations and deviations in the measurement or assessment of the planar or smooth characteristic of the decoupling layer. In some embodiments, for example, the first layer has a thickness of about 100 to 1000 nm.

The second and/or third barrier layers of the first and/or second laminates operate as the barrier layer component of the laminates, preventing the permeation of damaging gases, liquids and chemicals to the encapsulated device. As discussed generally above, the first and second laminates may include the second and third barrier layers directly on the respective first or second polymeric substrate, or may include one or more dyads including a decoupling layer between the respective first or second polymeric substrate and the second or third barrier layer (or between the third barrier layer of one second laminate and the second adhesive, as described above). Each of the second and third barrier layers is deposited on the respective first or second polymeric substrate of the respective first or second laminate, and deposition of the second and third barrier layers may vary depending on the material used for the layers. However, in general, any deposition technique and any deposition conditions can be used to deposit the second and third barrier layers. For example, the second and third barrier layers may be deposited using a vacuum process, such as sputtering, chemical vapor deposition, metalorganic chemical vapor deposition, plasma enhanced chemical vapor deposition, evaporation, sublimation, electron cyclotron resonance-plasma enhanced chemical vapor deposition, and combinations thereof.

In some embodiments, however, the second and third barrier layers are deposited by AC or DC sputtering. For example, in some embodiments, the second and third barrier layers are deposited on the polymeric substrate by AC sputtering. The AC sputtering deposition technique offers the advantages of faster deposition, better layer properties, process stability, control, fewer particles and fewer arcs. The conditions of the AC sputtering deposition are not particularly limited, and as would be understood by those of ordinary skill in the art, the conditions will vary depending on the area of the target and the distance between the target and the substrate. In some exemplary embodiments, however, the AC sputtering conditions may include a power of about 3 to about 6 kW, for example about 4 kW, a pressure of about 2 to about 6 mTorr, for example about 4.4 mTorr, an Ar flow rate of about 80 to about 120 seem, for example about 100 seem, a target voltage of about 350 to about 550 V, for example about 480V, and a track speed of about 90 to about 200 cm·min, for example about 141 cm/min. Also, although the inert gas used in the AC sputtering process can be any suitable inert gas (such as helium, xenon, krypton, etc.), in some embodiments, the inert gas is argon (Ar).

The material of the second and third barrier layers is not particularly limited, and may be any material suitable for substantially preventing or reducing the permeation of damaging gases, liquids and chemicals (e.g., oxygen and water vapor) to the encapsulated device. Some nonlimiting examples of suitable materials for the second and third barrier layers include metals, metal oxides, metal nitrides, metal oxynitrides, metal carbides, metal oxyborides, and combinations thereof. Those of ordinary skill in the art would be capable of selecting a suitable metal for use in the oxides, nitrides and oxynitrides based on the desired properties of the layer. However, in some embodiments, for example, the metal may be Al, Zr, Si, Zn, Sn or Ti.

The density and refractive index of the second and third barrier layers are also not particularly limited and will vary depending on the material of the layer. However, in some exemplary embodiments, the second and third barrier layers may have a refractive index of about 1.6 or greater, e.g., 1.675. The thicknesses of the second and third barrier layers are also not particularly limited. However, in some exemplary embodiments, the thickness of each of the second and third barrier layers is about 20 nm to about 100 nm, for example about 40 nm to about 70 nm. In some embodiments, for example, the thickness of each of the second and third barrier layers is about 40 nm. As is known to those of ordinary skill in the art, thickness is dependent on density, and density is related to refractive index. See, e.g., Smith, et al., "Void formation during film growth: A molecular dynamics simulation study," J. Appl. Phys., 79 (3), pgs. 1448-1457 (1996); Fabes, et al., "Porosity and composition effects in sol-gel derived interference filters," Thin Solid Films, 254 (1995), pgs. 175-180; Jerman, et al., "Refractive index of this films of $SiO_2$, $ZrO_2$, and $HfO_2$ as a function of the films' mass density," Applied Optics, vol. 44, no. 15, pgs. 3006-3012 (2005); Mergel, et al., "Density and refractive index of $TiO_2$ films prepared by reactive evaporation," Thin Solid Films, 3171 (2000) 218-224; and Mergel, D., "Modeling $TiO_2$ films of various densities as an effective optical medium," Thin Solid Films, 397 (2001) 216-222, all of which are incorporated herein by reference. Also, the correlation between film density and barrier properties is described, e.g., in Yamada, et al., "The Properties of a New Transparent and Colorless Barrier Film," Society of Vacuum Coaters, 505/856-7188, 38th Annual Technical Conference Proceedings (1995) ISSN 0737-5921, the entire content of which is also incorporated herein by reference. Accordingly, those of ordinary skill in the art would be able to calculate the density of the second and third barrier layers based on the refractive index and/or thickness information.

The first and second polymeric substrates of the respective first or second laminate may be any suitable substrate. In some embodiments, for example, each of the first and second polymeric substrates comprises a polymeric material, non-limiting examples of which may include polyethylene terephthalate (PET), polyethylene naphthalate (PEN), polycarbonate, polyimide, and polyetherether ketone (PEEK).

Figure 1:
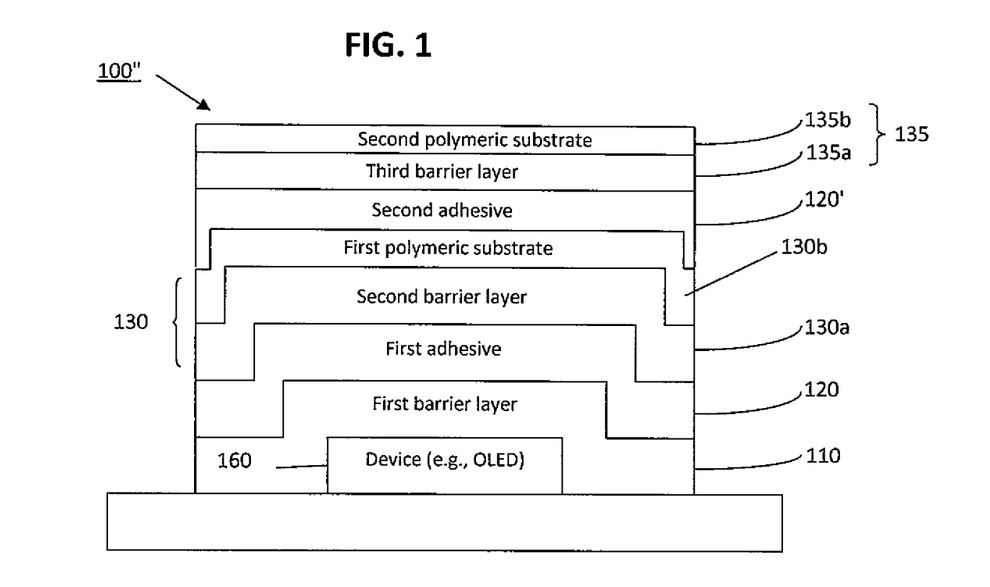
FIG. 1 is a schematic view of a barrier stack according to an embodiment of the present invention.
Figure 2:
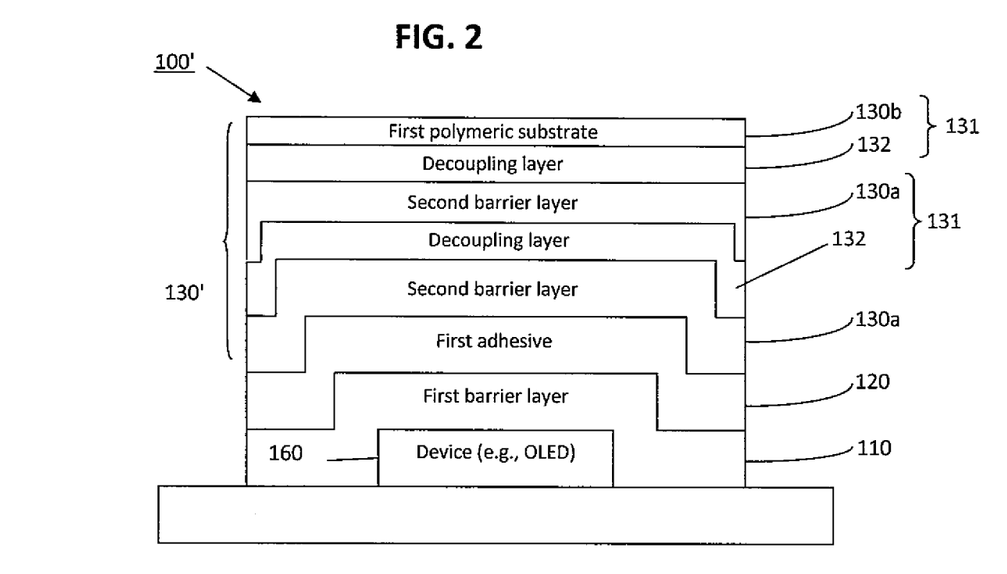
FIG. 2 is a schematic view of a barrier stack according to another embodiment of the present invention.
Figure 3:
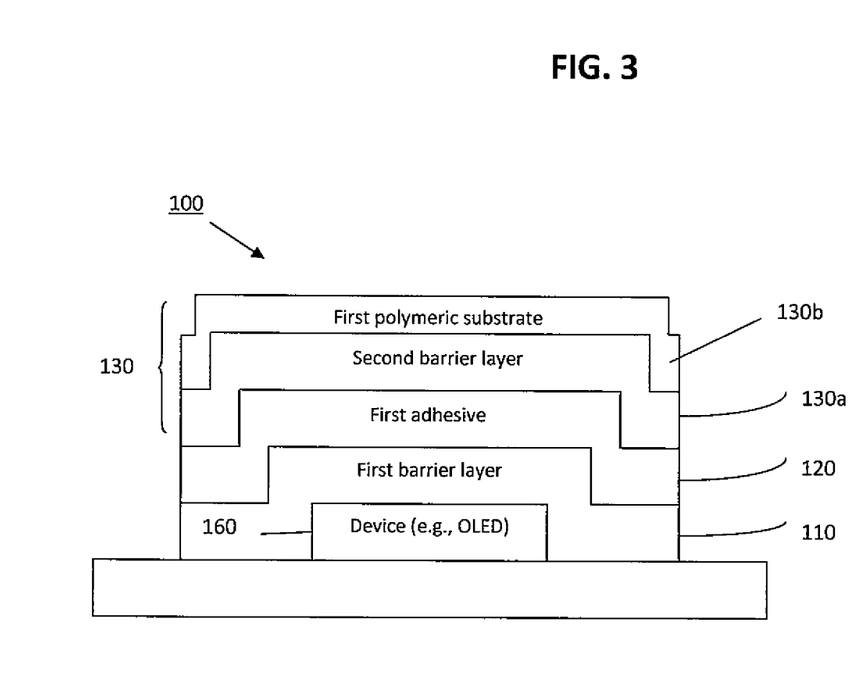
FIG. 3 is a schematic view of a barrier stack according to yet another embodiment of the present invention.

Exemplary embodiments of an encapsulated device are illustrated in FIGS. 1 through 3. The encapsulated device 100 depicted in FIG. 1 includes a first barrier layer 110 directly deposited on the underlying device 160, a first adhesive 120 on the first barrier layer 110, and a first laminate 130 on the first adhesive 120. The first laminate 130 includes a second barrier layer 130a on the adhesive 120, and a first polymeric substrate 130b on the second barrier layer 130a.

In some embodiments, for example, as shown in FIG. 2, the first laminate 130' may include one or more dyads 131 on the first polymeric substrate 130b, each of which dyads 131 includes a decoupling layer 132 in addition to the second barrier layer 130a. As can be seen in FIG. 2, the encapsulated device 100' resulting from the inclusion of such a first laminate 130' includes a first barrier layer 110 directly deposited on the underlying device 160, a first adhesive 120 on the first barrier layer 110, the second barrier layer 130a of the first laminate 130' on the first adhesive, the decoupling layer 132 of the first laminate 130' on the second barrier layer 130a, and the first polymeric substrate 130b on the decoupling layer 132.

In some embodiments, for example, as shown in FIG. 3, one or more second laminates 135 may be deposited on the first laminate 130 (or 130'). In such a structure, the encapsulated device 100" includes the first barrier layer 110 directly deposited on the underlying device 160, and the first adhesive 120 is deposited on the first barrier layer 110, as discussed above with respect to the encapsulated devices 100 and 100' of FIGS. 1 and 2. The encapsulated device 100" depicted in FIG. 3 includes the second barrier layer 130a of the first laminate 130 on the first adhesive 120, the first polymeric substrate 130b of the first laminate on the second barrier layer 130a, a second adhesive 120' on the second barrier layer 130a, and a second laminate 135 on the second adhesive 120'. The second laminate 135 includes a third barrier layer 135a on the second adhesive 130' and a second polymeric substrate 135b on the third barrier layer 135a.

Figure 5:
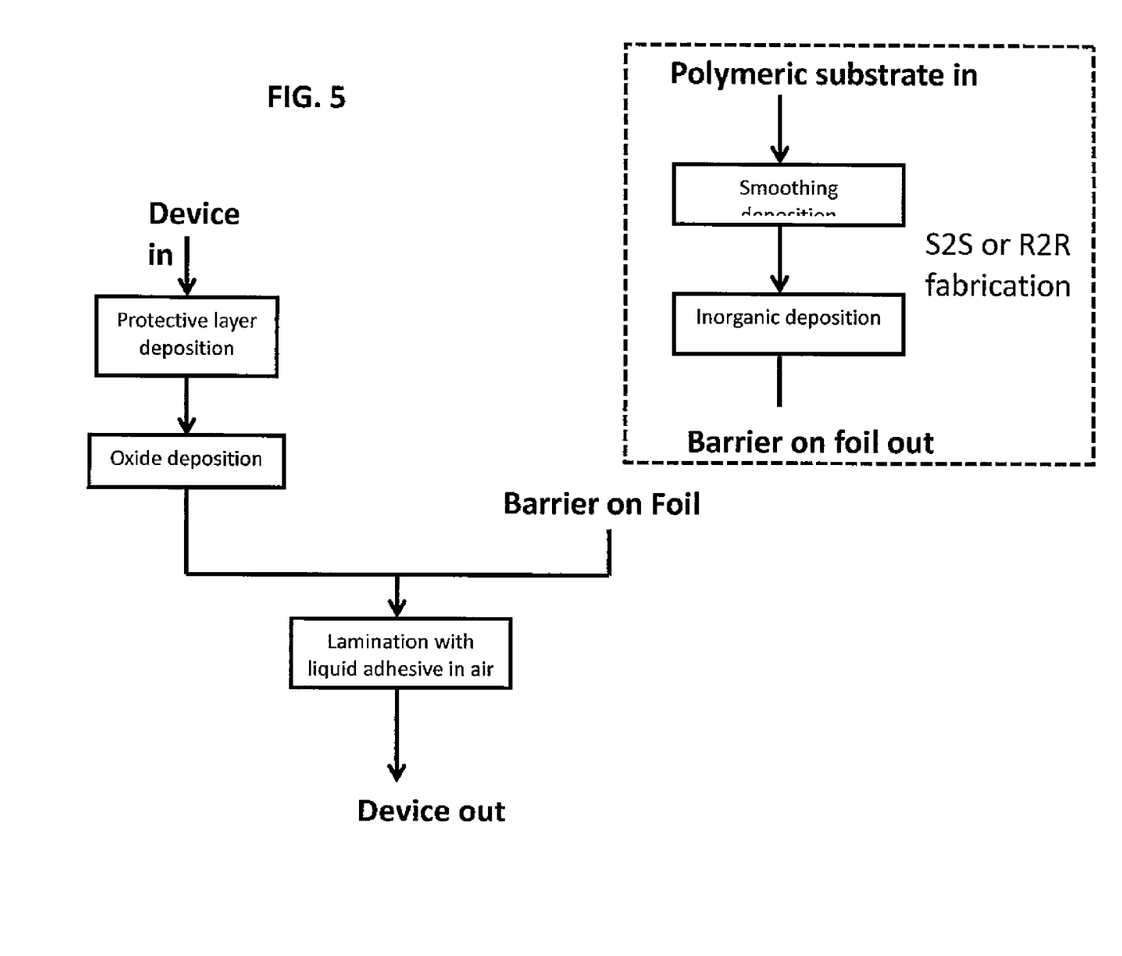
FIG. 5 is a schematic illustrating a method of encapsulating a device according to embodiments of the present invention.

In some embodiments of the present invention, as shown in FIG. 5, a method of encapsulating a device includes forming a first barrier layer 110 on the device 160 under an inert environment. The first barrier layer 110 may be deposited on the device 160 by any suitable deposition technique, as discussed above. The first barrier layer. 110 is as described above, and includes a first barrier material, as also described above.

The method further includes forming a first laminate 130 (or 130'). Forming the first laminate 130 (or 130') includes forming a second barrier layer 130a on a first polymeric substrate 130b. The second barrier layer and the first polymeric substrate are as described above. The second barrier layer may be deposited on the first polymeric substrate under an inert environment using a roll-to-roll or similar processing technique.

The method further includes applying a first adhesive 120 on the first barrier layer 110 in a non-inert environment, and applying the first laminate 130 (or 130') on the adhesive 120. The non-inert environment is as described above, and may be air or ambient conditions, or other non-inert (e.g., reactive) environment. The first adhesive is as described above, and may be a liquid adhesive, a curable adhesive or a pressure-sensitive adhesive. The first laminate 130 (or 130') may be applied to the adhesive such that the second barrier layer 130a of the first laminate 130 contacts the adhesive 120.

In some embodiments, as described above, the first laminate may further include a decoupling layer 132 between the second barrier layer 130a and the first polymeric substrate 130b. As also described above, in these embodiments, the decoupling layer 132 and the second barrier layer 130a form a dyad 131, and the first laminate 130 may include one or more dyads. For example, in some embodiments, the first laminate includes a single dyad, and in some embodiments, the first laminate includes two or more dyads. In these embodiments, the method may further include depositing the decoupling layer 132 on the first polymeric substrate 130b, followed by deposition of the second barrier layer 130a on the decoupling layer 130b. The decoupling layer may be deposited by any suitable technique, as described above.

In some embodiments, the method further includes forming one or more second laminates 135. Forming each of the second laminates may include forming a third barrier layer 135a on a second polymeric substrate 135b. The third barrier layer and the second polymeric substrate are as described above. In these embodiments, the method may further include applying a second adhesive 120' on the first laminate 130 in a non-inert environment, and applying a second laminate 135 on the second adhesive 120' in the non-inert environment. In embodiments in which the encapsulated device 100" includes two or more second laminates 135, the method may further include applying the second adhesive 120' between each of the second laminates 135 in the non-inert environment.

As discussed above, according to embodiments of the present invention, an encapsulated device includes a first barrier layer deposited directly on the device under an inert environment, and a first laminate applied on the first barrier layer under a non-inert environment. This hybrid encapsulation scheme creates an effective barrier against the ingress of harmful species (e.g., water vapor and oxygen) to the encapsulated device while also downsizing the deposition equipment needed to operate under an inert environment. As the first barrier layer deposited directly on the device provides barrier protection long enough to enable application of an adhesive and lamination of the separately formed laminate, much of the encapsulation can be done in a non-inert environment (e.g., in air or ambient conditions). This simplifies the encapsulation process and enables use of a significantly smaller deposition apparatus due to the reduction in the number of inert chambers needed to complete deposition of the encapsulation.

While certain exemplary embodiments of the present invention have been illustrated and described, it is understood by those of ordinary skill in the art that certain modifications and changes can be made to the described embodiments without departing from the spirit and scope of the present invention.

What is claimed is:

1. A method of making an encapsulated device, the method comprising:
   depositing a first barrier layer on the device in an inert environment, the first barrier layer comprising a first barrier material;
   forming a first laminate comprising forming a second barrier layer on a polymeric substrate, the second barrier layer comprising a second barrier material;
   applying an adhesive on the first barrier layer in a non-inert environment; and
   applying the laminate on the adhesive in the non-inert environment.

2. The method of claim 1, wherein the first and second barrier materials are each independently selected from the group consisting of metals, metal oxides, metal nitrides, metal oxynitrides, metal carbides, metal oxyborides, Al, Zr, Zn, Sn, Ti, and combinations thereof.

3. The method of claim 1, wherein the first laminate further comprises a decoupling layer between the polymeric substrate and the second barrier layer, the decoupling layer and the second barrier layer forming a dyad.

4. The method of claim 3, wherein the first laminate comprises a single dyad.

5. The method of claim 3, wherein the first laminate comprises two or more dyads.

6. The method of claim 1, wherein the first adhesive comprises a liquid adhesive.

7. The method of claim 1, further comprising:
   forming one or more second laminates, wherein the forming each of the second laminates comprises forming a third barrier layer on a polymeric substrate, the third barrier layer comprising a third barrier material;
   applying a second adhesive on the first laminate in the non-inert environment; and
   applying one of the one or more second laminates on the second adhesive in the non-inert environment.

8. The method of claim 7, further comprising applying the second adhesive between each of the one or more second laminates in the non-inert environment.

9. The method of claim 7, wherein the one or more second laminates comprises two or more laminates.

10. The method of claim 7, wherein the third barrier material is selected from the group consisting of metals, metal oxides, metal nitrides, metal oxynitrides, metal carbides, metal oxyborides, Al, Zr, Zn, Sn, Ti, and combinations thereof.

11. The method of claim 7, wherein the second adhesive comprises a liquid adhesive.

* * * * *